United States Patent
Koo et al.

(10) Patent No.: US 9,379,350 B2
(45) Date of Patent: Jun. 28, 2016

(54) DUAL MODE DISPLAY APPARATUS AND METHOD OF MANUFACTURING THE SAME

(71) Applicant: Electronics and Telecommunications Research Institute, Daejeon (KR)

(72) Inventors: Jae Bon Koo, Daejeon (KR); Hojun Ryu, Seoul (KR); Chi-Sun Hwang, Daejeon (KR); Jeong Ik Lee, Gunpo (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 189 days.

(21) Appl. No.: 13/830,002

(22) Filed: Mar. 14, 2013

(65) Prior Publication Data

US 2013/0314633 A1    Nov. 28, 2013

(30) Foreign Application Priority Data

May 22, 2012  (KR) .................. 10-2012-0054408
Nov. 12, 2012  (KR) .................. 10-2012-0127619

(51) Int. Cl.
*G02F 1/1335* (2006.01)
*G02F 1/136* (2006.01)
*H01L 51/52* (2006.01)
*H01L 33/08* (2010.01)
(Continued)

(52) U.S. Cl.
CPC ........ *H01L 51/5203* (2013.01); *H01L 27/3232* (2013.01); *H01L 33/08* (2013.01); *G02F 1/13718* (2013.01); *G02F 1/167* (2013.01); *G02F 2201/44* (2013.01); *G02F 2203/02* (2013.01)

(58) Field of Classification Search
CPC . G02F 1/13718; G02F 1/167; G02F 2201/44; G02F 2203/02; H01L 51/5203; H01L 33/08; H01L 27/3232; H01L 51/56; H01J 9/247; H01J 9/261
USPC ................... 349/43, 69, 122, 74; 257/59, 72; 438/30; 313/498–512; 445/23–25
See application file for complete search history.

(56) References Cited

U.S. PATENT DOCUMENTS 5,920,083 A * 7/1999 Bae ................................. 257/59
6,849,877 B2 * 2/2005 Yamazaki ........... H01L 27/3244
                                                            257/290

(Continued)

FOREIGN PATENT DOCUMENTS

KR    10-2008-0112673 A    12/2008

OTHER PUBLICATIONS

Birendra Bahadur, Liquid Crystals Applications and Uses, 1990, World Scientific, vol. 1, pp. 171-194.*

*Primary Examiner* — Edward Glick
*Assistant Examiner* — David Chung

(57) ABSTRACT

A dual mode display apparatus according to the inventive concept includes a lower substrate, a first lower electrode on the lower substrate, a light switching layer on the first lower electrode, a first upper electrode on the light switching layer, a passivation layer on the first upper electrode, a contact plug connected to the first upper electrode and penetrating the passivation layer, a second lower electrode on the contact plug and the passivation layer, an organic light-emitting layer on the second lower electrode, a second upper electrode on the organic light-emitting layer, and an upper substrate on the second upper electrode.

5 Claims, 8 Drawing Sheets

(51) Int. Cl.
*H01L 27/32* (2006.01)
*G02F 1/137* (2006.01)
*G02F 1/167* (2006.01)

(56) References Cited

U.S. PATENT DOCUMENTS

| | | | |
|---|---|---|---|
| 7,170,506 B2 | 1/2007 | Eldon et al. | |
| 7,239,361 B2* | 7/2007 | Kato | G02F 1/133553 |
| | | | 313/463 |
| 8,987,718 B2* | 3/2015 | Koo | H01L 51/5203 |
| | | | 257/40 |
| 9,236,577 B2* | 1/2016 | Koo | H01L 51/50 |
| 2003/0218704 A1* | 11/2003 | Lee et al. | 349/106 |
| 2004/0109106 A1* | 6/2004 | Yang | G02F 1/133603 |
| | | | 349/69 |
| 2006/0072047 A1* | 4/2006 | Sekiguchi | 349/25 |
| 2006/0132461 A1* | 6/2006 | Furukawa | H01L 27/3274 |
| | | | 345/173 |
| 2006/0255719 A1* | 11/2006 | Oikawa et al. | 313/503 |
| 2008/0272375 A1* | 11/2008 | Oh | G02F 1/13471 |
| | | | 257/72 |
| 2011/0267279 A1 | 11/2011 | Rivera et al. | |
| 2012/0013700 A1* | 1/2012 | Horiuchi et al. | 347/225 |
| 2012/0273721 A1* | 11/2012 | Liu | C09K 19/0275 |
| | | | 252/299.01 |

* cited by examiner

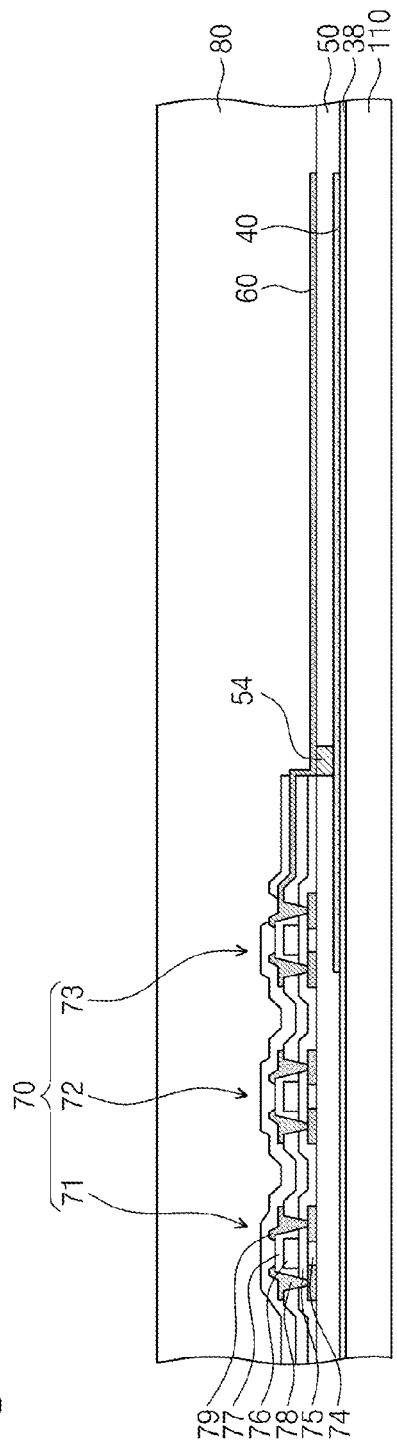
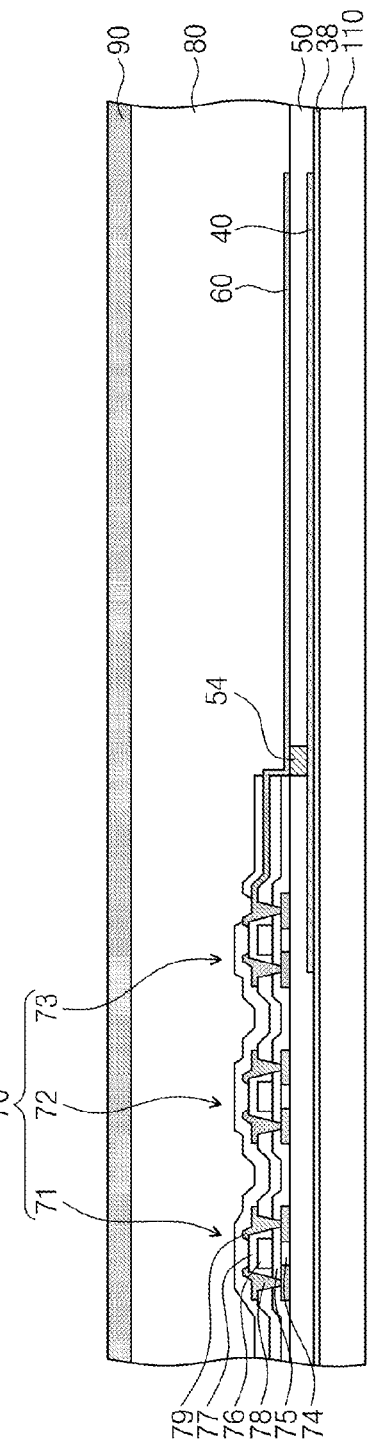

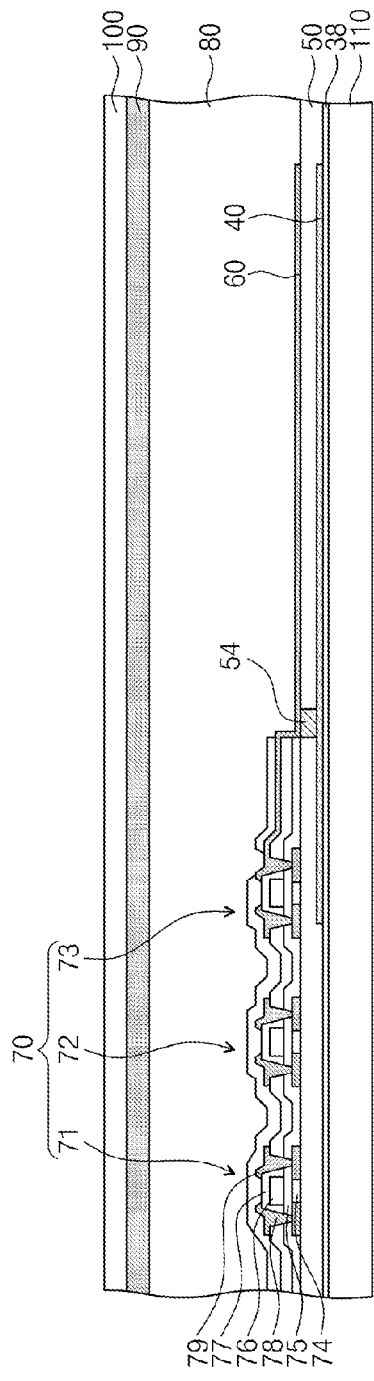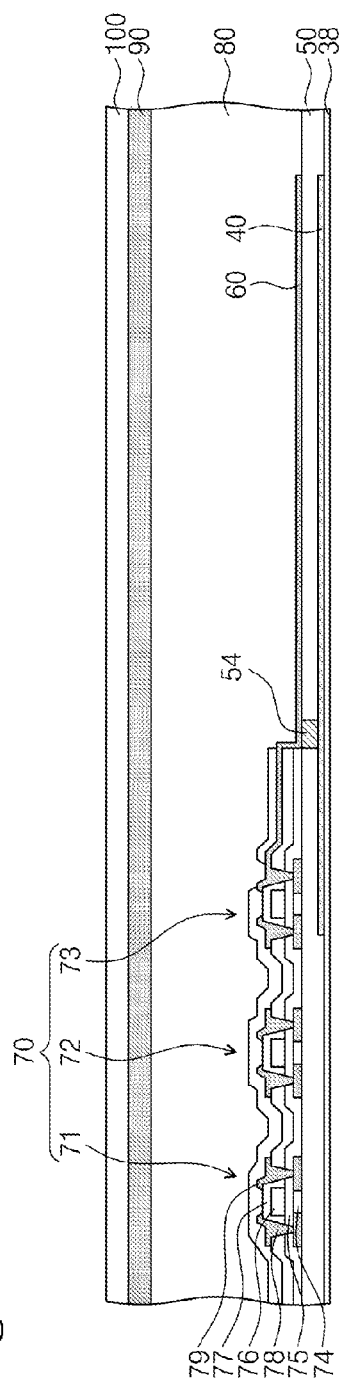

DUAL MODE DISPLAY APPARATUS AND METHOD OF MANUFACTURING THE SAME

CROSS-REFERENCE TO RELATED APPLICATIONS

This U.S. non-provisional patent application claims priority under 35 U.S.C. §119 to Korean Patent Application Nos. 10-2012-0054408 and 10-2012-0127619, filed on May 22, 2012 and Nov. 12, 2012, the entirety of which is incorporated by reference herein.

BACKGROUND

The inventive concept relates to a display apparatus and a method of manufacturing the same and, more particularly, to reflection and self-light emission types of a dual mode display apparatus and a method of manufacturing the same.

A flat panel display (FPD) industry is very important in the present information age. The FPD may display an image by controlling the intensity of transmitted light or self-emitting light in response to an image control signal. A liquid crystal display (LCD) and an organic light-emitting display (OLED) may correspond to typical FPDs.

The LCDs may be categorized as any one of transmission type LCDs and reflection type LCDs. White light generated in a back light unit may be transmitted through two polarizing plates and a liquid crystal layer in the transmission type LCD, so as to be modulated. The transmitted white light may pass through a color filter layer to realize a color. The transmission type LCDs may be driven by a low voltage, such that these may be widely used in mobile portable devices, notebooks, computer monitors, and/or televisions. However, the transmission type LCDs may use a portion of the light transmitted through the polarizing plates and the color filter layer, such that light efficiency of the transmission type LCDs may be low. Additionally, the back light unit may increase power consumption of the transmission type LCDs. Thus, various researches are being conducted for the reflection type LCDs from which the back light units are removed. The reflection type LCDs may reflect external light to display an image in bright surroundings.

The OLEDs are spotlighted because of their low power consumption and self-emission characteristics. The OLED may include a plurality of substrates opposite to each other, a plurality of electrodes between the substrates, an organic light-emitting material between the electrodes. The substrates may include a flexible material such a plastic. Thus, the OLED may be realized as a stretchable display. The organic light-emitting material generates excitons by electrons and holes applied through the electrodes. The excitons emit light in the organic light-emitting material. As a result, the OLED displays an image with self-light.

Recently, a dual mode display apparatus is suggested by combination of the OLED and the reflection type LCD. The dual mode display apparatus adjusts an external environment to realize super-saving electric power.

SUMMARY

Embodiments of the inventive concept may provide a dual mode display apparatus having a self-light emission mode and a reflection mode and a method of manufacturing the same.

Embodiments of the inventive concept may also provide a dual mode display apparatus capable of improving productivity and a method of manufacturing the same.

In one aspect, a dual mode display apparatus may include: a lower substrate; a first lower electrode on the lower substrate; a light switching layer on the first lower electrode; a first upper electrode on the light switching layer; a passivation layer on the first upper electrode; a contact plug connected to the first upper electrode, the contact plug penetrating the passivation layer; a second lower electrode on the contact plug and the passivation layer; an organic light-emitting layer on the second lower electrode; a second upper electrode on the organic light-emitting layer; and an upper substrate on the second upper electrode.

In an embodiment, the dual mode display apparatus may further include: an etch stop layer disposed between the first upper electrode and the light switching layer.

In an embodiment, the dual mode display apparatus may further include: an adhesive layer disposed between the etch stop layer and the light switching layer.

In an embodiment, the adhesive layer may include a polymer film.

In an embodiment, the light switching layer may include a photonic crystal layer.

In an embodiment, the light switching layer may further include a liquid crystal layer.

In an embodiment, the dual mode display apparatus may further include: a thin film transistor part adjacent to the second lower electrode and disposed between the passivation layer and the organic light-emitting layer.

In an embodiment, the first lower electrode may be a transparent electrode; and the second upper electrode may be a reflection electrode.

In an embodiment, on the other hand, the first lower electrode may be a reflection electrode; and the second upper electrode may be a transparent electrode.

In another aspect, a method of manufacturing a dual mode display apparatus may include: forming a first lower electrode on a lower electrode; forming a first upper electrode on a dummy substrate; forming a passivation layer exposing the first upper electrode on the dummy substrate; forming a second lower electrode and a thin film transistor electrically connected to the first upper electrode on the passivation layer; forming an organic light-emitting layer on the second lower electrode and the thin film transistor; forming a second upper electrode on the organic light-emitting layer; forming an upper substrate covering the second upper electrode; removing the dummy substrate; and bonding the lower substrate to the upper substrate with a light switching layer between the first lower electrode and the first upper electrode.

In an embodiment, the method may further include: forming an etch stop layer between the dummy substrate and the first upper electrode.

In an embodiment, bonding the lower substrate to the upper substrate may include: forming the light switching layer on the first lower electrode; forming an adhesive layer on the light switching layer; and bonding the adhesive layer to the etch stop layer.

In an embodiment, the dummy substrate may be removed by a dry etching method, a wet etching method, or a chemical mechanical polishing method.

In an embodiment, forming the passivation layer and the second lower electrode may include: forming the passivation layer on the first upper electrode; removing a portion of the passivation layer to form a contact hole exposing the first upper electrode; forming a contact plug in the contact hole; and forming a second lower electrode on the contact plug and the passivation layer.

BRIEF DESCRIPTION OF THE DRAWINGS

The inventive concept will become more apparent in view of the attached drawings and accompanying detailed description.

FIGS. 4 to 16 are cross-sectional views illustrating a method of manufacturing according to exemplary embodiments of the inventive concept.

DETAILED DESCRIPTION OF THE EMBODIMENTS

Figure 1:
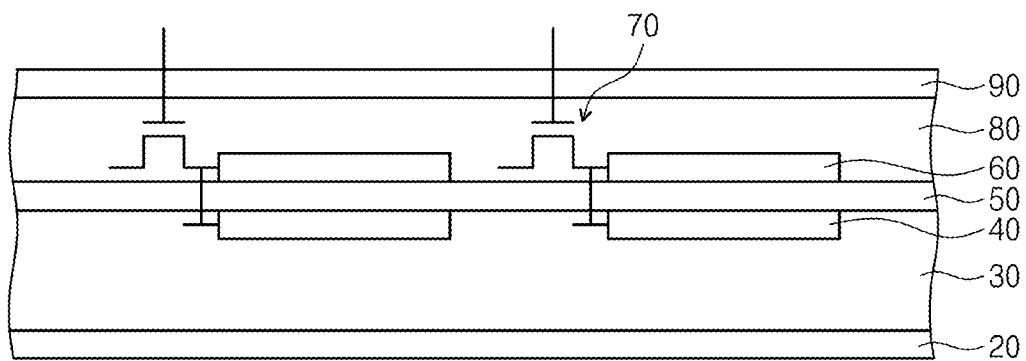
FIG. 1 is a schematic diagram illustrating a display apparatus according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

FIG. 1 is a schematic diagram illustrating a display apparatus according to exemplary embodiments of the inventive concept.

Referring to FIG. 1, a display apparatus according to embodiments of the inventive concept includes a first lower electrode 20, a light switching layer 30, a first upper electrode 40, a passivation layer 50, a second lower electrode 60, a thin film transistor part 70, an organic light-emitting layer 80, and a second upper electrode 90.

The first lower electrode 20 and the second upper electrode 90 may be cathodes applying negative voltages to the light switching layer 30 and the organic light-emitting layer 80, respectively. The first upper electrode 40 and the second lower electrode 60 may be anodes applying positive voltages to the light switching layer 30 and the organic light-emitting layer 80, respectively. The light switching layer 30 is disposed between the first lower electrode 20 and the first upper electrode 40. The organic light-emitting layer 80 may be disposed between the second lower electrode 60 and the second upper electrode 90. The first upper electrode 40 and the second lower electrode 60 may be disposed between the light switching layer 30 and the organic light-emitting layer 80. The thin film transistor part 70 may be connected to the first upper electrode 40 and the second lower electrode 60.

The first upper electrode 40, the thin film transistor part 70, and the second lower electrode 60 may be fixed on the passivation layer 50. The passivation layer 50 may be a back plane fixing the thin film transistor part 70. The passivation layer 50 may separate the light switching layer 30 from the organic light-emitting layer 80. The organic light-emitting layer 80 may emit self-light by a bias current between the second upper electrode 90 and the second lower electrode 60. The organic light-emitting layer 80 may perform a self-light emission mode of the display apparatus. The display apparatus may effectively display a self-light emission mode image in a dark room. Even though not shown in the drawings, the organic light-emitting layer 80 may include a hole injecting layer, a hole transport layer, a light-emitting layer, an electron transport layer, and an electron injecting layer.

The light switching layer 30 may absorb or transmit external light. The absorption or the transmission of the external light may be determined by an electric field in the light switching layer 30. The electric field may be induced between the first lower electrode 20 and the first upper electrode 40. The light switching layer 30 may be driven in a reflection mode of the display apparatus. The display apparatus may display a reflection mode image in a bright space.

As a result, the display apparatus according to the inventive concept may realize dual mode. The dual mode display apparatus may reduce or minimize energy consumption. The dual mode display apparatus may display the image frontward or backward according to reflectance and/or transmittance of the first lower electrode 20 or the second upper electrode 90. These will be described with reference to embodiments.

Figure 2:
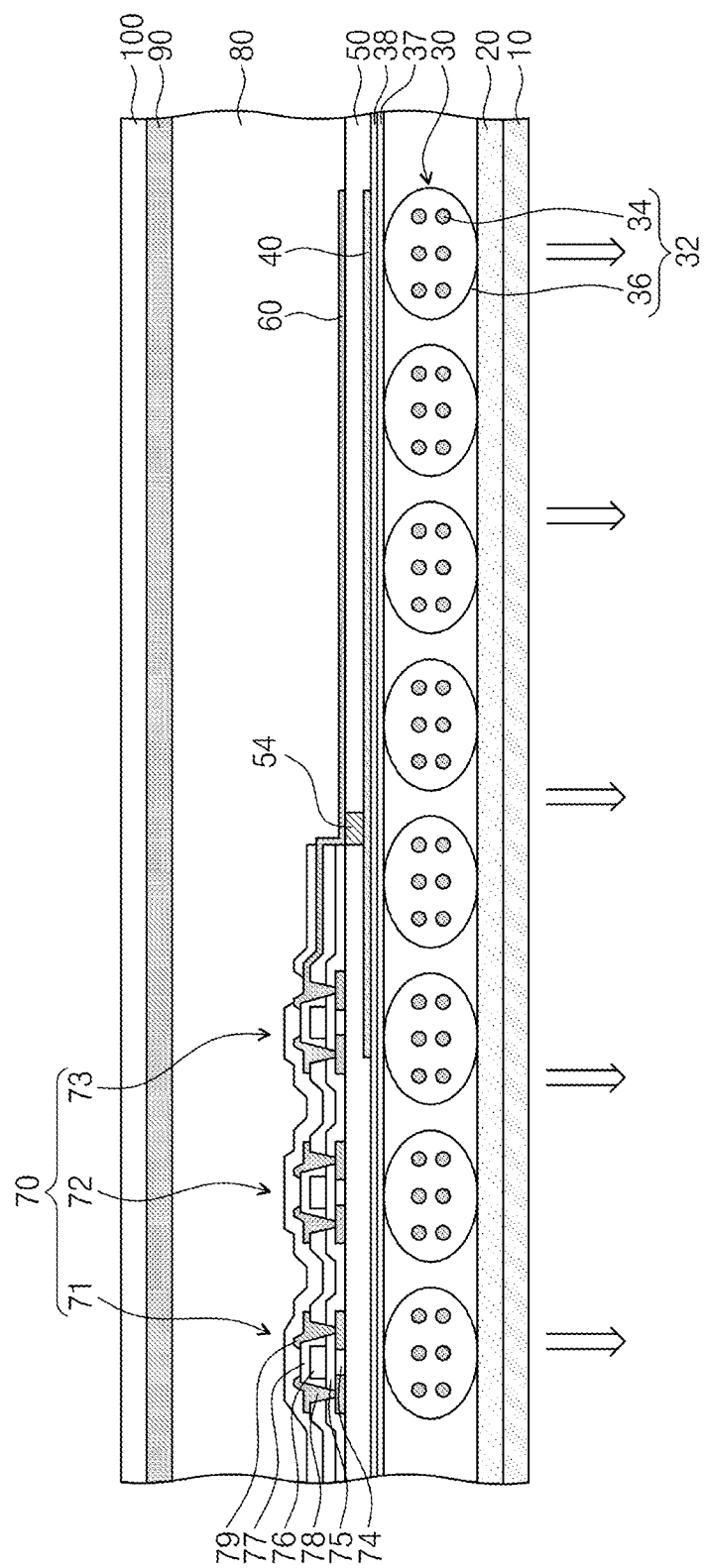
FIG. 2 is a cross-sectional view illustrating a dual mode display apparatus according to a first embodiment of the inventive concept.

FIG. 2 is a cross-sectional view illustrating a dual mode display apparatus according to a first embodiment of the inventive concept. Referring to FIG. 2, a dual mode display apparatus according to a first embodiment of the inventive concept displays an image in a backward direction. Here, the backward direction is defined as a direction from an upper substrate 100 to a lower substrate. The first lower electrode 20 is a transparent electrode transmitting the self-light and the external light, and the second upper electrode 90 is a reflection electrode reflecting the self-light and the external light.

The first lower electrode 20 may be disposed on the lower substrate 10. The first lower electrode 20 may include at least one of a transparent metal (e.g., indium tin oxide (ITO) or indium zinc oxide (IZO)) and a transparent conductive material (e.g., silver nano wire, carbon nano tube, graphene, PEDOT:PSS, polyaniline, or polythiophene).

The second upper electrode 90 may be disposed beneath the upper substrate 100. The second upper electrode 90 may include a black metal such as tungsten (W), aluminum (Al), or silver (Ag). The first lower electrode 20 and the second upper electrode 90 are fixed on the lower substrate 10 and the upper substrate 100, respectively. Each of the lower and upper substrates 10 and 100 may include a transparent glass or a transparent plastic.

The first upper electrode 40 and the second lower electrode 60 correspond to pixel electrodes defining a sub-pixel. The first upper electrode 40 and the second lower electrode 60 may include a transparent metal such as ITO or IZO. The first upper electrode 40 and the second lower electrode 60 may be electrically connected to each other through a contact plug 54. The contact plug 54 may penetrate the passivation layer 50. Additionally, the first upper electrode 40 and the second lower electrode 60 may be connected to the thin film transistor part 70.

The thin film transistor part 70 may include a sampling thin film transistor 71, a driving thin film transistor 72, and a programming thin film transistor 73. Each of the sampling thin film transistor 71, the driving thin film transistor 72, and the programming thin film transistor 73 may include an active layer 74, a gate insulating layer 75 disposed on the active layer 74 and the passivation layer 50, a gate electrode 76 disposed on the gate insulating layer 75 on the active layer 74, a gate upper insulating layer 77 disposed on the gate electrode 76 and the gate insulating layer 75, and source/drain electrodes 78 and 79 respectively connected to the active layer 74 at both sides of the gate electrode 76. The source/drain electrodes 78 and 79 may be spaced apart from each other and may successively penetrate the gate upper insulating layer 77 and the gate insulating layer 75. The transistors 71, 72, and 73 of the thin film transistors part 70 may have top gate structures as illustrated in FIG. 2. However, the inventive concept is not limited thereto. In other embodiments, the transistors 71, 72, and 73 of the thin film transistor part 70 may have bottom gate structures.

The thin film transistor part 70 may control a bias voltage and a bias current applied to the second lower electrode 60. The bias voltage may correspond to a data signal which is turned-on in response to a gate signal. The sampling thin film transistor 71 may control the bias voltage. The data signal and the gate signal may be applied through a data line (not shown) and a gate line (not shown), respectively. The bias current may be supplied to the second lower electrode 60 from a current source (not shown).

The driving thin film transistor 72 and the programming thin film transistor 73 may control the bias current. The first upper electrode 40 and the second lower electrode 60 may be connected to the drain electrode 79 of the programming thin film transistor 73. However, the inventive concept is not limited thereto. In other embodiments, the sampling thin film transistor 71 and the programming thin film transistor 73 may connected in common to the first upper electrode 40 and the second lower electrode 60.

The first lower electrode 20 transmits the external light and a reflected light, and the second upper electrode 90 reflects the external light. The light switching layer 30 may transmit the external light and the reflected light when an electric field is not induced between the first lower electrode 20 and the first upper electrode 40. The bias voltage may induce the electric field between the first lower electrode 20 and the first upper electrode 40. The light switching layer 30 may transmit the external light and the reflected light when the electric field is induced. However, the inventive concept is not limited thereto.

At this time, the second upper electrode 90 may be floated. The driving thin film transistor 72 and the programming thin film transistor 73 may be turned-off. Additionally, the current source does not supply the bias current. The reflection mode image may be displayed in black and white when the organic light-emitting layer 80 is transparent. When the organic light-emitting layer 80 has a color, the reflection mode image may be disposed in color.

The light switching layer 30 may include electronic-ink microcapsules (or phonic crystals) 32. The photonic crystal 32 includes electrophoretic particles 34 and a capsule 36. The electrophoretic particles 34 may be densely concentrated in the capsule 36. At this time, the light switching layer 30 may transmit the external light or the self-light. Alternatively, when the electric field is induced between the first lower electrode 20 and the first upper electrode 20, the electrophoretic particles 34 may be widely disperse in the capsule 36. In this case, the light switching layer 30 may block the external light and the self-light. The light switching layer 30 may include a liquid crystal layer. The liquid crystal layer may include one of nematic liquid crystal, smetic liquid crystal, or cholesteric liquid crystal.

An etch stop layer 38 and an adhesive layer 37 are disposed between the light switching layer 30 and the passivation layer 50. The etch stop layer 38 may include a silicon oxide layer, a silicon nitride layer, and/or a silicon oxynitride layer. The adhesive layer 37 may bond the etch stop layer 38 to the light switching layer 30. Additionally, the adhesive layer 37 may fix the capsule 36. The adhesive layer 37 may include a polymer film. The passivation layer 50 may include a transparent dielectric such as a silicon oxide layer or a silicon oxynitride layer. The adhesive layer 40 may be a laminated liquid crystal protecting film.

The organic light-emitting layer 80 may include a transparent material. The organic light-emitting layer 80 may transmit a white external light or a white reflected light. The organic light-emitting layer 80 may have one of the three primary colors. The organic light-emitting layer 80 may provide the color to the external light or the reflected light. The organic light-emitting layer 80 may include an electron transport layer, a hole transport layer, and a light-emitting layer. The light-emitting layer may emit the self-light of a red color, a green color, or a blue color. The self-light may increase in proportion to the bias current. At this time, the first lower electrode 20 is floated. The first lower electrode 20 and the light switching layer 30 may transmit the self-light. The self-light mode image may be transmitted through the light switching layer 30 to be displayed.

As a result, the dual mode display apparatus according to the first embodiment of the inventive concept may display the reflection mode or self-light mode image in the backward direction.

Figure 3:
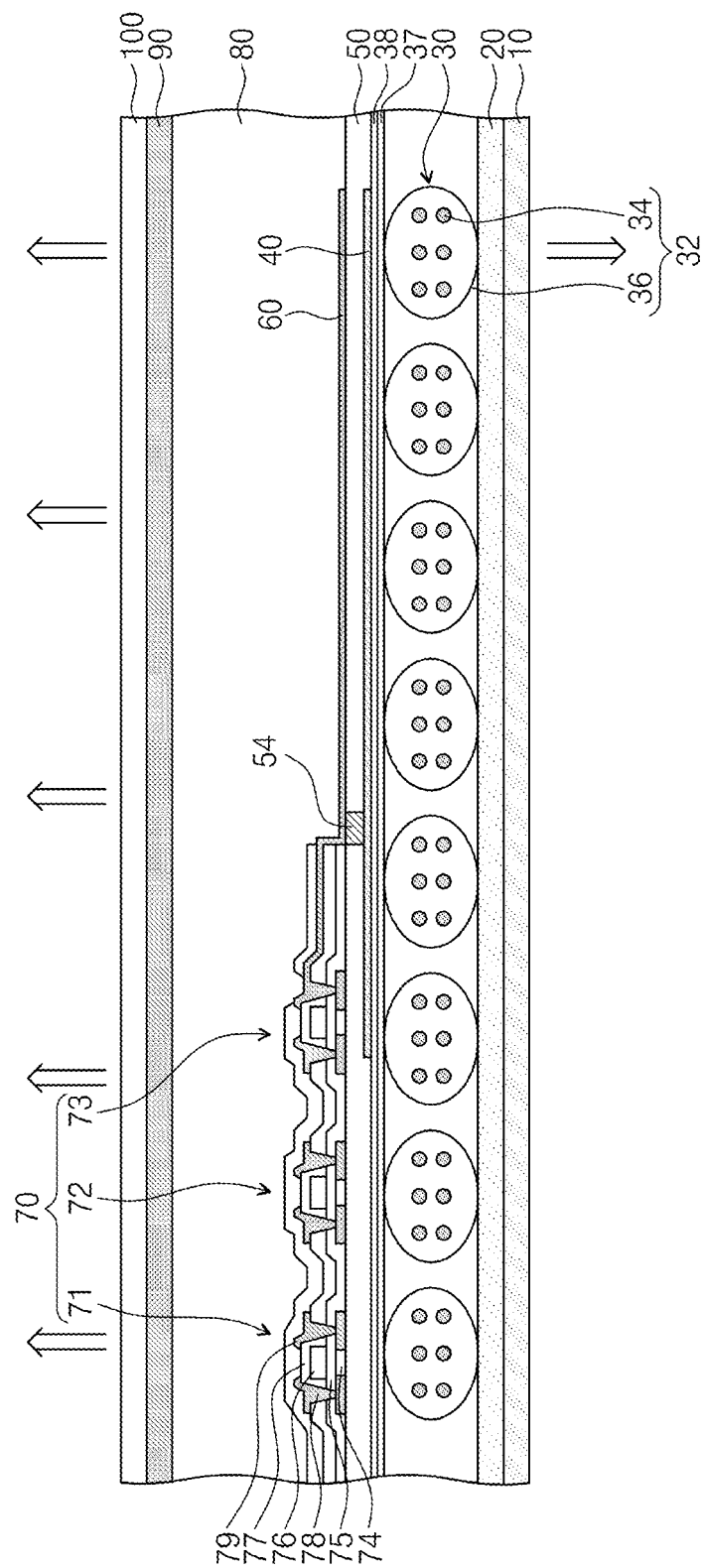
FIG. 3 is a cross-sectional view illustrating a dual mode display apparatus according to a second embodiment of the inventive concept.

FIG. 3 is a cross-sectional view illustrating a dual mode display apparatus according to a second embodiment of the inventive concept.

Referring to FIG. 3, a dual mode display apparatus according to a second embodiment displays an image in a frontward direction. The frontward direction is defined as a direction from the lower substrate 10 to the upper substrate 100. The first lower electrode 20 is a reflection electrode, and the second upper electrode 90 is a transparent electrode. The first lower electrode 20 may include an opaque metal. The opaque metal may include tungsten (W), aluminum (Al), and/or silver (Ag). The opaque metal may have a black color. The second upper electrode 90 may include at least one of indium tin oxide (ITO), indium zinc oxide (IZO), silver nano wire, carbon nano tube, graphene, PEDOT:PSS, polyaniline, or polythiophene.

The organic light-emitting layer 80 may display the self-light mode image in the frontward direction. The organic light-emitting layer 80 may include a transparent material. In the reflection mode, a black-and-white image may be realized. When the organic light-emitting layer 80 has one of the three primary colors, a colored image of the reflection mode may be displayed in the frontward direction.

In the second embodiment, the transmittance and/or reflectance of the first lower electrode 20 of the first embodiments may be exchanged for the transmittance and/or reflectance of the second upper electrode 90 of the first embodiment.

A method of manufacturing the dual mode display apparatuses described above will be described hereinafter.

FIGS. 4 to 16 are cross-sectional views illustrating a method of manufacturing according to exemplary embodiments of the inventive concept.

Figure 4:

Referring to FIG. 4, an etch stop layer 38 is formed on a dummy substrate 110. The etch stop layer 38 may include at least one of a silicon oxide layer and a silicon oxynitride layer which are formed by a chemical vapor deposition (CVD) method.

Figure 5:
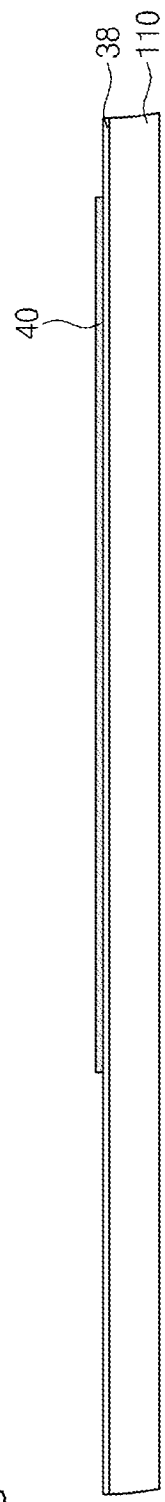

Referring to FIG. 5, a first upper electrode 40 is formed on the etch stop layer 38. The first upper electrode 40 may include a transparent metal. The transparent metal may include ITO and/or IZO. The first upper electrode 40 may be formed by a patterning process including a deposition process of the transparent metal, a photolithography process, and an etching process. The deposition process of the transparent metal may include a sputtering process.

Figure 6:
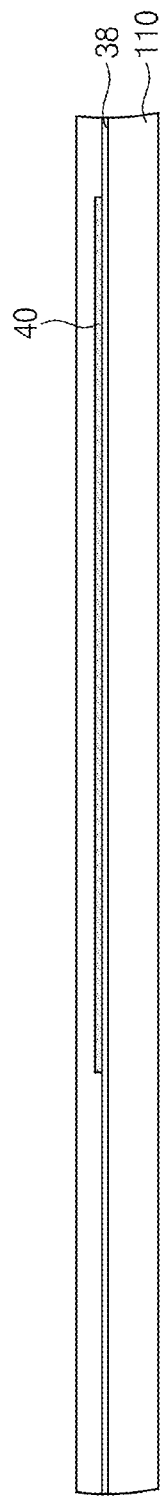

Referring to FIG. 6, a passivation layer 60 is formed on an entire surface of the dummy substrate 110. The passivation layer 50 may be formed by a CVD process and/or a rapid thermal treatment process. The passivation layer 50 may include a silicon oxide layer, a silicon nitride layer, and/or a silicon oxynitride layer.

Figure 7:
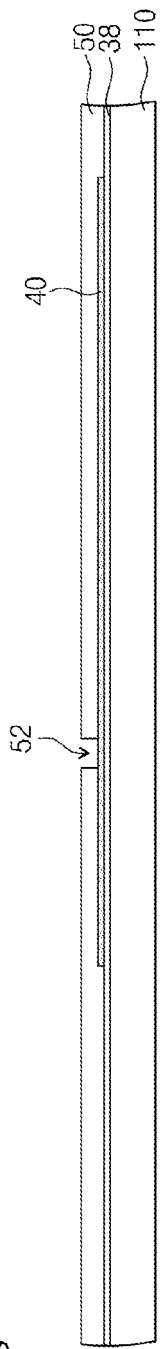

Referring to FIG. 7, a portion of the passivation layer 50 on the first upper electrode 40 may be removed to form a contact hole 52. The contact hole 42 may be formed by a photolithography process and an etching process.

Figure 8:
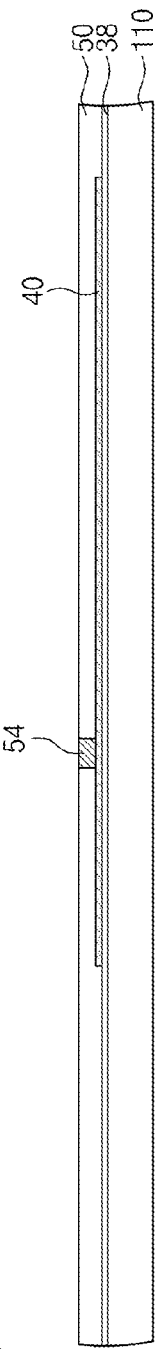
Figure 9:
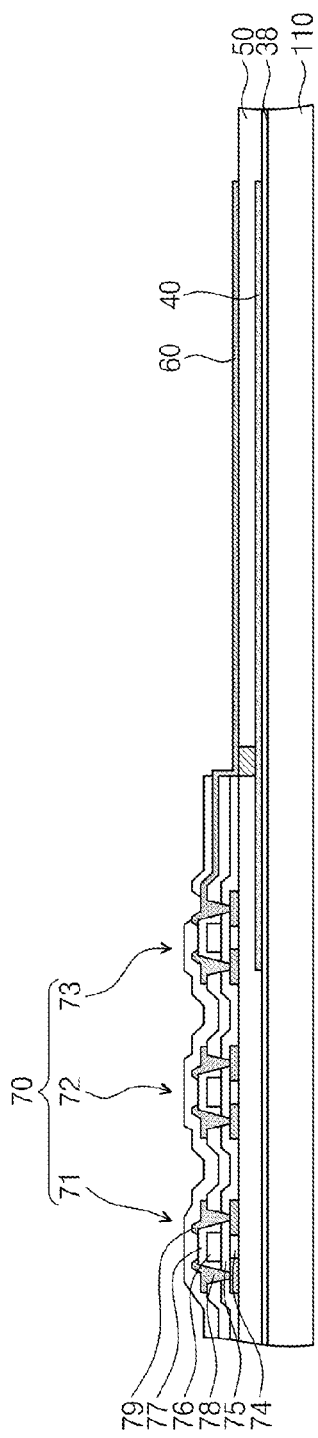

Referring to FIG. 8, a contact plug 54 is formed in the contact hole 52. The contact plug 54 may be formed by a doctor blade method, an ink jet printing method, or an electroplating method. In the doctor blade method, a conductive ink filling the contact hole 52 may be flat removed. In the ink jet printing method, a conductive ink may be transferred in the contact hole 52. In the electroplating method, the contact plug 54 may be formed in the contact hole 52 using the first upper electrode immersed in an electrolytic solution as an anode Referring to FIG. 9, a thin film transistor part 70 is formed on the passivation layer 50 and a second lower electrode 60 is formed on the contact plug 54. The thin film transistor part 60 may be formed through a plurality of unit processes. The unit processes may include deposition processes, photolithography processes, and etching processes. The thin film transistor part 70 may include an active layer 74, source/drain electrodes 78 and 79, a gate insulating layer 75, a gate upper insulating layer 77, and a gate electrode 76 including a metal. The active layer 74 may include poly-silicon. The gate insulating layer 75 may include a dielectric such as a silicon oxide layer. The poly-silicon and the dielectric may be formed by deposition processes of a CVD method. The poly-silicon may be patterned by a photolithography process and an etching process. The source/drain electrodes 78 and 79 and the gate electrode 76 may include a transparent metal such as ITO. The transparent metal may be formed by a deposition process such as a sputtering process. Additionally, the transparent metal may be patterned by a photolithography process and an etching process.

The second lower electrode 60 may include a transparent metal such as ITO or IZO. The transparent metal for the second lower electrode 60 may be formed by a physical vapor deposition (PVD) method such as sputtering method or a molecular beam epitaxy (MBE) method. The transparent metal for the second lower electrode 60 may be patterned by a photolithography process and an etching process. At this time, the transparent metal for the second lower electrode 60 and the transparent metal for one of the gate electrode 76 and the source/drain electrodes 78 and 79 may be formed at the same time by a the same deposition process. In other embodiments, the second lower electrode 60 may include a transparent conductive material such as silver nano wire, carbon nano tube, graphene, PEDOT:PSS, polyaniline, or polythiophene. The transparent conductive material may be formed by a CVD method, a spin coating method, or an implanting method.

Referring to FIG. 10, an organic light-emitting layer 80 is formed on the thin film transistor part 70 and the second lower electrode 60. The organic light-emitting layer 80 may be formed by a spin coating method, a sol-gel method, or a CVD method.

Referring to FIG. 11, a second upper electrode 90 is formed on the organic light-emitting layer 80. The second upper electrode 90 may include a transparent metal, an opaque metal, or a transparent conductive material which may be formed by a PVD method or a CVD method. According to a first embodiment of the inventive concept, the second upper electrode 90 may be formed of the opaque metal having a high reflectance. The opaque metal may include tungsten (W), aluminum (Al), or silver (Ag) which may have the high reflectance. According to a second embodiment of the inventive concept, the second upper electrode 90 may be formed of the transparent metal or the transparent conductive material. The transparent metal may include ITO, IZO, or silver nano wire. The conductive material may include carbon nano tube, graphene, PEDOT:PSS, polyaniline, or polythiophene. Here, the graphene may be formed by a tape laminating method.

Referring to FIG. 12, an upper substrate 100 is provided on the second upper electrode 90. The upper substrate 100 may include glass or plastic. The plastic has flexibility. Even though not shown in the drawings, after the second upper electrode 90 is formed on the upper substrate 100, the second upper electrode 90 may be bonded to the organic light-emitting layer 80.

Referring to FIG. 13, the dummy substrate 110 is removed. The dummy substrate 110 may be removed by a wet etching method, a dry etching method, or a chemical mechanical polishing (CMP) method. The etch stop layer 38 may protect the first upper electrode 40 and the passivation layer 50 when the dummy substrate 110 is removed.

Figure 14:
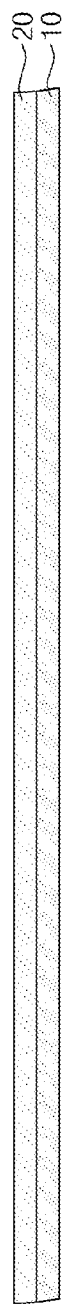

Referring to FIG. 14, a first upper electrode 20 is formed on a lower substrate 10 opposite to the upper substrate 100. The lower electrode 20 may include a transparent metal, a transparent conductive material, or an opaque metal which is formed by a PVD method or a CV method. According to the first embodiment of the inventive concept, the first lower electrode 20 may include the transparent metal or the transparent conductive material. According to the second embodiment of the inventive concept, the first lower electrode 20 may include the opaque metal.

Figure 15:
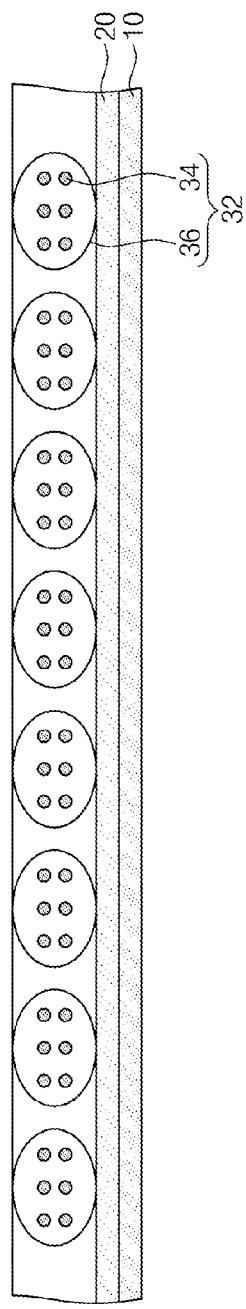

Referring to FIG. 15, a light switching layer 30 is formed on the first lower electrode 20. The light switching layer 30 may drop on the first lower electrode 20.

Figure 16:
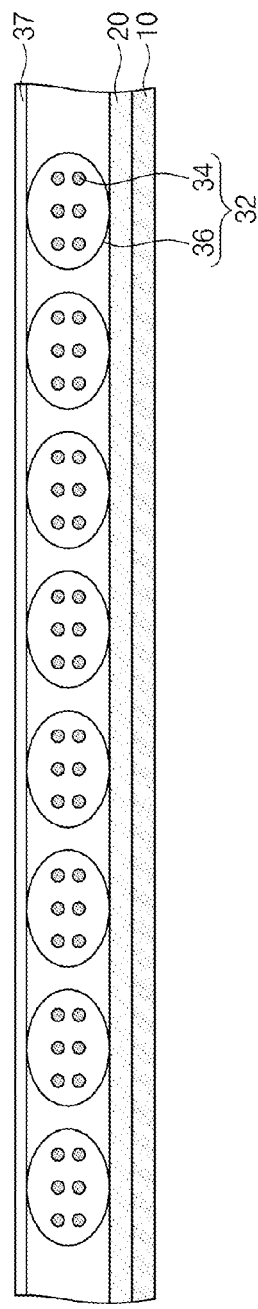

Referring to FIG. 16, an adhesive layer 37 is formed on the light switching layer 30. The adhesive layer 37 may include a conductive polymer formed by a spin coating method, a PVD method, or a CVD method.

Referring to FIGS. 2 and 3 again, the adhesive layer 37 is bonded to the etch stop layer 38. Even though not shown in the drawings, a sealant may be formed between edges of the lower substrate 10 and the upper substrate 100 to fix the lower and upper substrates 10 and 100 to each other. The organic light-emitting 80 and the light switching layer 30 may be fixed by bonding the lower substrate 10 to the upper substrate 100.

The dual mode display apparatus according to the inventive concept includes the lower substrate, the first lower electrode, the light switching layer, the first upper electrode, the passivation layer, the contact plug, the second lower electrode, the organic light-emitting layer, the second upper electrode, and the upper substrate. The organic light-emitting layer may display the self-light mode image. Thus, the dual mode display apparatus may be effectively driven in the self-light mode manner in a dark room. One of the first lower electrode and the second upper electrode is the transparent electrode, and the other is the reflection electrode. The reflection electrode and the light switching layer may display the reflection mode image. The reflection mode image may be displayed by the external light. Thus, the dual mode display apparatus may be driven in the reflection mode manner in a bright space. The dual mode display apparatus realizing the self-light mode and the reflection mode may reduce or minimize energy consumption thereof. Thus, the dual mode display apparatus according to the inventive concept may improve productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a dual mode display apparatus comprising:
   forming a first lower electrode on a lower substrate;
   forming a first upper electrode on a dummy substrate;
   forming a passivation layer exposing the first upper electrode on the dummy substrate;
   forming a second lower electrode and a thin film transistor electrically connected to the first upper electrode on the passivation layer;
   forming an organic light-emitting layer on the second lower electrode and the thin film transistor;
   forming a second upper electrode on the organic light-emitting layer;
   forming an upper substrate covering the second upper electrode;
   removing the dummy substrate; and
   bonding the lower substrate to the upper substrate with a light switching layer between the first lower electrode and the first upper electrode.

2. The method of claim 1, further comprising:
   forming an etch stop layer between the dummy substrate and the first upper electrode.

3. The method of claim 2, wherein bonding the lower substrate to the upper substrate comprises:
   forming the light switching layer on the first lower electrode;
   forming an adhesive layer on the light switching layer; and
   bonding the adhesive layer to the etch stop layer.

4. The method of claim 1, wherein the dummy substrate is removed by a dry etching method, a wet etching method, or a chemical mechanical polishing method.

5. The method of claim 1, wherein forming the passivation layer and the second lower electrode comprises:
   forming the passivation layer on the first upper electrode;
   removing a portion of the passivation layer to form a contact hole exposing the first upper electrode;
   forming a contact plug in the contact hole; and
   forming a second lower electrode on the contact plug and the passivation layer.

* * * * *